(12) United States Patent
Hamada et al.

(10) Patent No.: US 10,254,868 B2
(45) Date of Patent: Apr. 9, 2019

(54) DISPLAY DEVICE HAVING PRESSURE SENSOR

(71) Applicant: Japan Display Inc., Minato-ku (JP)

(72) Inventors: Yuki Hamada, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/794,109

(22) Filed: Oct. 26, 2017

(65) Prior Publication Data

US 2018/0136767 A1    May 17, 2018

(30) Foreign Application Priority Data

Nov. 15, 2016 (JP) ................................. 2016-222073

(51) Int. Cl.
| | |
|---|---|
| *G06F 3/041* | (2006.01) |
| *H01L 51/52* | (2006.01) |
| *G06F 3/044* | (2006.01) |
| *H01L 27/32* | (2006.01) |

(52) U.S. Cl.
CPC ............ *G06F 3/0412* (2013.01); *G06F 3/044* (2013.01); *H01L 51/5246* (2013.01); *H01L 51/5253* (2013.01); *G06F 2203/04105* (2013.01); *H01L 27/323* (2013.01); *H01L 27/3244* (2013.01)

(58) Field of Classification Search
CPC ...... G06F 3/0412; G06F 3/0416; G06F 3/044; H01L 41/5246

USPC .................................................. 345/173, 174
See application file for complete search history.

(56) References Cited

U.S. PATENT DOCUMENTS

| | | | |
|---|---|---|---|
| 9,780,125 B2 * | 10/2017 | Koide | .................... H01L 27/124 |
| 2012/0182249 A1 | 7/2012 | Endo et al. | |
| 2013/0222297 A1 * | 8/2013 | Adachi | .................... G06F 3/041 |
| | | | 345/173 |

FOREIGN PATENT DOCUMENTS

JP        2011-76172        4/2011

* cited by examiner

*Primary Examiner* — Calvin C Ma
(74) *Attorney, Agent, or Firm* — Oblon, McClelland, Maier & Neustadt, L.L.P.

(57) ABSTRACT

To provide a display device having a pressure sensor, including a plurality of first electrodes formed discretely at positions above a display area, a plurality of dielectric layers formed discretely on each of the plurality of first electrodes, a plurality of second electrodes formed on the plurality of dielectric layers, an elastic layer formed on each of the plurality of first electrodes in an area not overlapping the plurality of dielectric layers and the plurality of second electrodes, and a third electrode formed continuously in an area over the plurality of first electrodes, the plurality of dielectric layers, the plurality of second electrodes, and the plurality of elastic layers, wherein the third electrode is spaced apart from the dielectric layer and the second electrode, and the elastic layer is in contact with the first electrode and the third electrode.

10 Claims, 12 Drawing Sheets

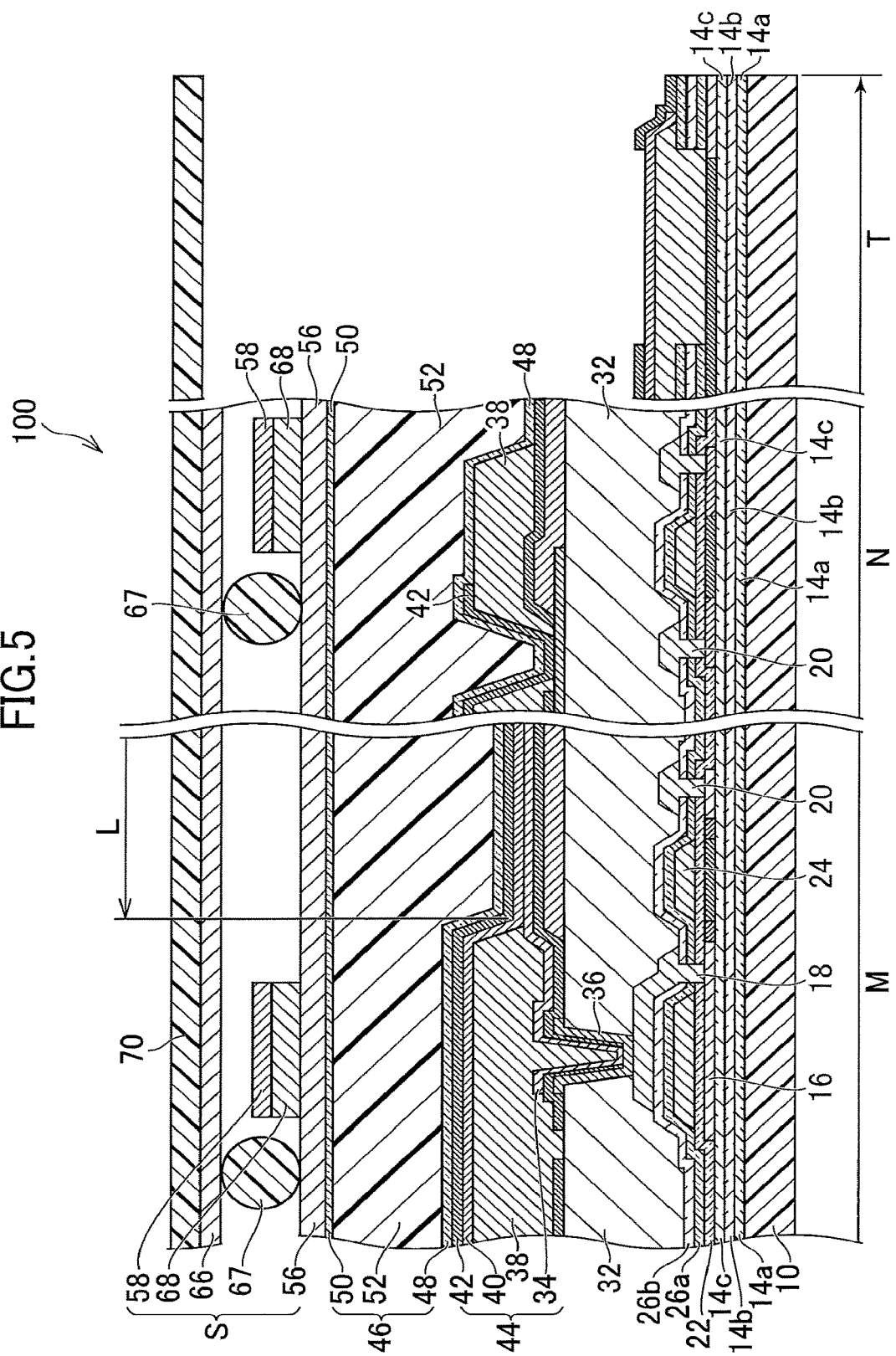

DISPLAY DEVICE HAVING PRESSURE SENSOR

CROSS-REFERENCE TO RELATED APPLICATION

The present application claims priority from Japanese application JP2016-222073 filed on Nov. 15, 2016, the content of which is hereby incorporated by reference into this application.

BACKGROUND OF THE INVENTION

1. Field of the Invention

The present invention relates to a display device having a pressure sensor.

2. Description of the Related Art

There has been known a display device equipped with a pressure sensor that detects presence of a touch when a display surface is touched with a finger, for example (for example, JP 2011-076172 A).

As a touch detection method employed by a pressure sensor, an electrostatic capacitance method is available. For example, an elastic layer is formed between electrodes to detect change in electrostatic capacitance based on change in distance between the electrodes attributed to compression of the elastic layer caused when the display surface is pressed with a finger. This structure enables detection of the presence of a touch. However, change alone in distance between electrodes due to compression of an elastic layer is insufficient to cause a sufficiently large change in electrostatic capacitance, and accurate detection of the presence of a touch is hardly achievable. In view of the above, the inventor of this application has discussed modification of the structure of a pressure sensor in order to improve accuracy in touch detection.

SUMMARY OF THE INVENTION

It is an object of the present invention to provide a display device having a pressure sensor that detects the presence of a touch with high accuracy.

According to one aspect of the present invention, there is provided a display device having a pressure sensor including: a display area where a plurality of pixels are arranged in a matrix; a sealing film formed covering the display area; and a pressure sensor mounted on the sealing film, wherein the pressure sensor includes a plurality of first electrodes formed discretely on the sealing layer at positions above the display area, a plurality of dielectric layers formed discretely on each of the plurality of first electrodes, a plurality of second electrodes formed on the plurality of dielectric layers, an elastic layer formed on each of the plurality of first electrodes in an area not overlapping the plurality of dielectric layers and the plurality of second electrodes, and a third electrode formed continuously in an area over the plurality of first electrodes, the plurality of dielectric layers, the plurality of second electrodes, and the plurality of elastic layers, the third electrode is spaced apart from the second electrode, and the elastic layer is in contact with the first electrode and the third electrode.

According to another aspect of the present invention, there is provided a display device having a pressure sensor including: a display area where a plurality of pixels are arranged in a matrix; a sealing film formed covering the display area; a pressure sensor mounted on the sealing film; and a counter substrate disposed on the pressure sensor so as to face the display area, wherein the pressure sensor includes a plurality of first electrodes formed discretely on the sealing layer at positions above the display area, a plurality of dielectric layers formed on the sealing film and between the plurality of first electrodes, an elastic layer formed on the sealing film in an area not overlapping the plurality of first electrodes and the plurality of dielectric layers, and a second electrode formed above the respective first electrodes that sandwich the dielectric layer, and the second electrode is spaced apart from the first electrode, and the elastic layer is in contact with the sealing film and the counter substrate.

BRIEF DESCRIPTION OF THE DRAWINGS

FIG. 5 is across sectional view of a display device according to the first embodiment, sectioned along a line passing through the pressure sensor;

FIG. 6A is a cross sectional view of the pressure sensor with the display area not pressed with a finger or the like;

FIG. 6B illustrates the pressure sensor with the display area M pressed with a finger or the like;

DETAILED DESCRIPTION OF THE INVENTION

Figure 1:
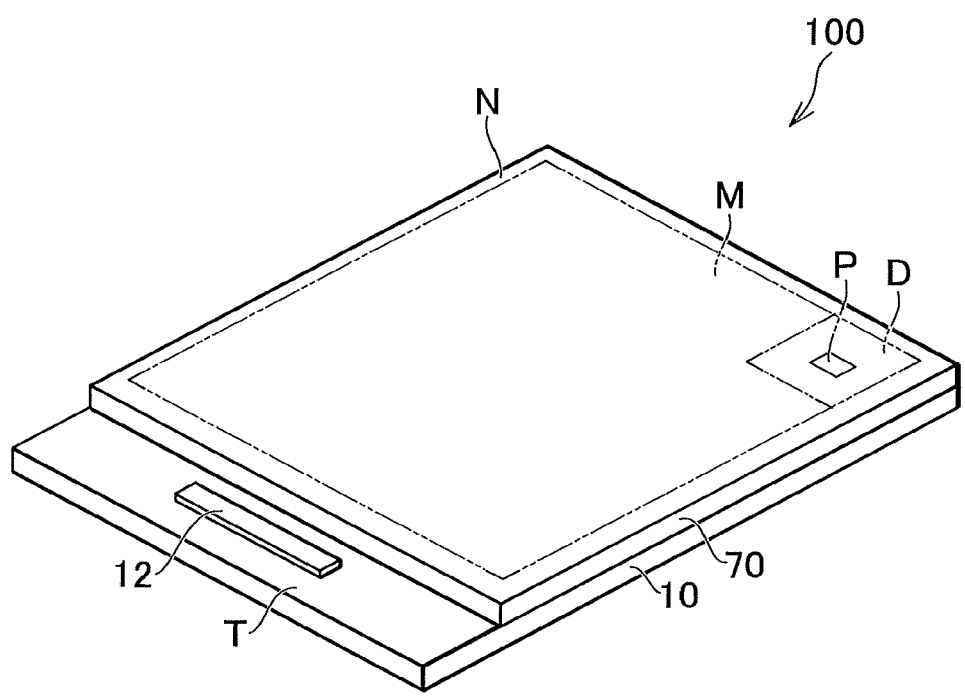
FIG. 1 is a schematic perspective view of a complete structure of a display device according to a first embodiment.

The following describes embodiments of the present invention with reference to the drawings. The present invention can be rendered into practice according to many aspects that do not depart from the gist of the present invention, and should not be interpreted as being limited to the content described in the embodiments described below as examples.

The drawings may illustrate the widths, thicknesses, shapes or the like of respective members more schematically as compared with those in actual aspects in order to make clearer the explanation. Those illustrated are mere examples, and should not limit interpretation of the present invention in any way. In the specification and respective drawings, members having functions similar to those already described with reference to the drawings already referred to are given the same reference numerals, and a description thereof may be omitted.

In defining a positional relationship between one member and another member in the detailed description of the present invention, a member "on" or "under" another member refers not only to a member directly on or under another component but also a member on or under another member with still another member intervening between the one member and the other member unless otherwise stated.

FIG. 1 is a schematic perspective view of a complete structure of a display device having a pressure sensor (hereinafter simply referred to as a display device) according to a first embodiment. As an example of a display device, an organic electro-luminescence display device is described below. A display device 100 includes unit pixels (sub-pixels) for a plurality of colors, such as, red, green, and blue, for example, which together constitute a full-color pixel P to display a full-color image. The display device 100 includes a first substrate 10. The first substrate 10 includes a display area M where a plurality of pixels P are arranged in a matrix. The display area M is divided into a plurality of sections D. The first substrate 10 includes a frame area N around the display area M. The first substrate 10 additionally includes a terminal area T. The terminal area T has an integrated circuit chip 12 thereon for driving an element for displaying an image. The terminal area T may be connected to a flexible substrate (not shown) for electrical connection to outside.

Figure 2:
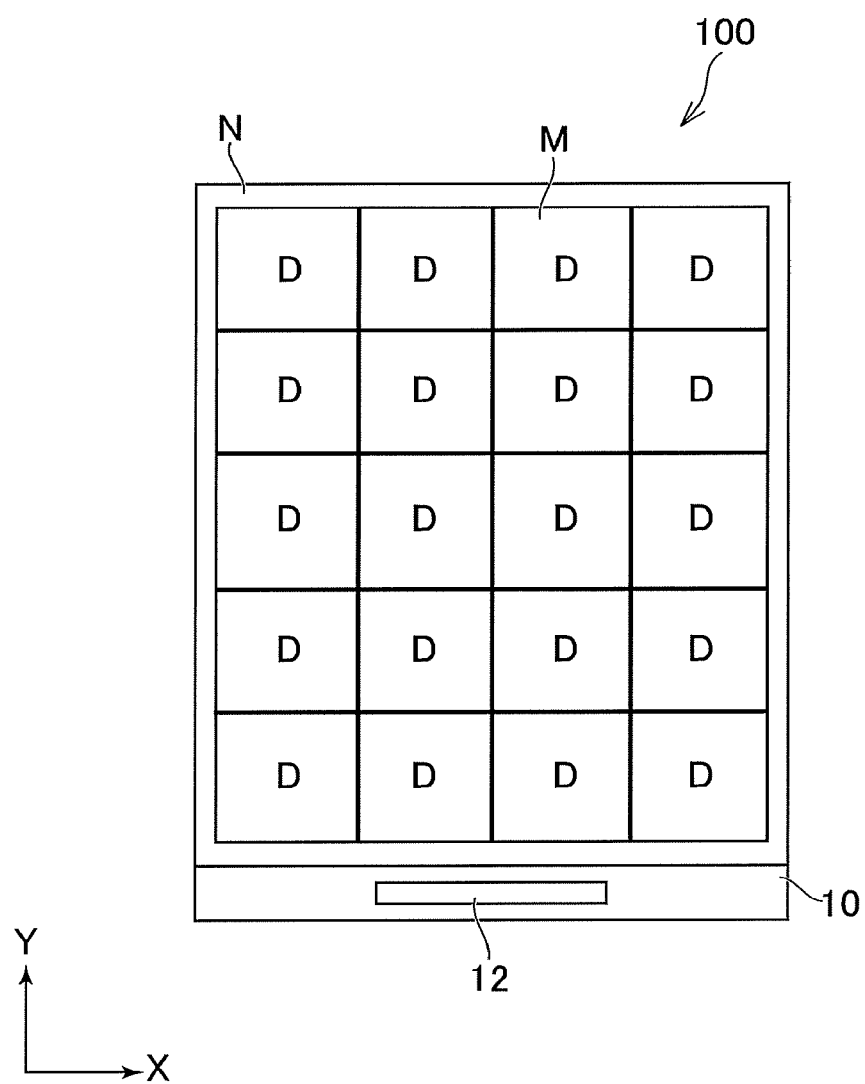
FIG. 2 is a schematic plan view of a complete structure of the display device according to the first embodiment.
Figure 3:
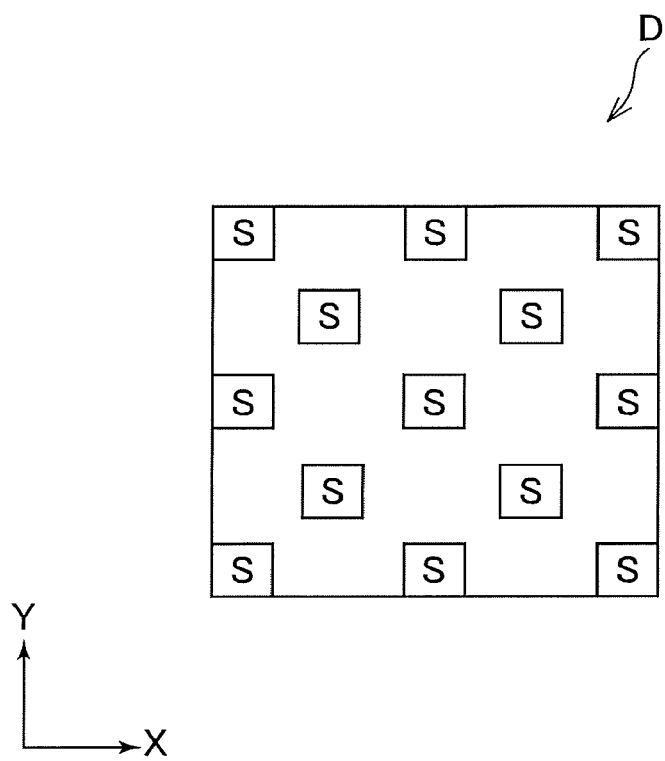
FIG. 3 is a plan view of a structure in one section illustrated in FIG. 2.
Figure 4:
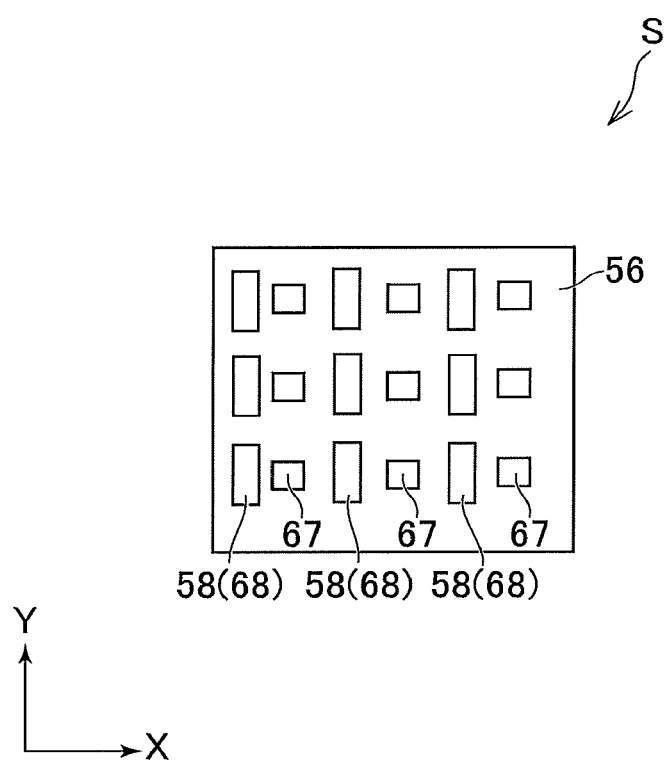
FIG. 4 is a plan view of a structure of a pressure sensor illustrated in FIG. 3.

FIG. 2 is a schematic plan view of a complete structure of a display device according to the first embodiment. FIG. 3 is a plan view of a structure in one section illustrated in FIG. 2. FIG. 4 is a plan view of a structure of a pressure sensor illustrated in FIG. 3.

In FIG. 2, the display area M is divided into four sections in the X direction and five sections in the Y directions so that twenty sections D are resulted. This, however, is a mere example, and the display area M may be divided into five sections in the X direction and six sections in the Y direction so that thirty sections D may be resulted, for example. Each section D may be a rectangular area in a plan view of each of which sides is about 2 to 3 cm long.

Each section D has pressure sensors S discretely disposed thereon. FIG. 3 illustrates a structure including thirteen pressure sensors S in each section D, though the number and positions of the pressure sensors S are not limited to the illustrated. Each pressure sensor S may have a rectangular shape in a plan view of each of which sides is about 200 um to 300 um long, though this is not intended to be exclusive, and the pressure sensor S may have a different shape, such as a round shape, in a plan view.

FIG. 4 is a plan view of the pressure sensor S viewed from a counter substrate 70 (see FIG. 5). The pressure sensor S includes a first electrode 56, a second electrode 58, a third electrode 66 (not shown in FIG. 4), an elastic layer 67, and a dielectric layer 68. The elastic layer 67 is made of insulating flexible resin. Insulating flexible resin may include water dispersible polyurethane, for example, though any elastic and deformable resin is applicable. The elastic layer 67 may have a rectangular shape in a plan view, of each of which sides is about 15 um to 20 um long, though this is not intended to be exclusive, and the elastic layer 67 may have any other shape, such as a round shape, in a plan view.

Details of the structure of the pressure sensor S will be described later with reference to FIG. 5, FIG. 6, or other figures.

FIG. 5 is a cross sectional view of a display device according to the first embodiment, sectioned along a line passing through a pressure sensor. The first substrate 10 is made of resin or glass, and may be a flexible film such as polyimide, polyethylene terephthalate, or the like. The first substrate 10 has undercoat layers 14a, 14b, 14c thereon that serve as a barrier against impurities in the first substrate 10. The undercoat layer 14a is formed using a silicon oxide film; the undercoat layer 14b is formed using a silicon nitride film; and the undercoat layer 14c is formed using a silicon oxide film. The undercoat layer 14a improves adhesion between the first substrate 10 and the undercoat layer 14b. The undercoat layer 14b prevents impurities from diffusing from the first substrate 10 toward the semiconductor layer of a thin film transistor to be formed thereafter. The undercoat layer 14c improves adhesion between the undercoat layer 14b and a layer including the thin film transistor, and to prevent hydrogen from diffusing from the undercoat layer 14b toward the semiconductor layer of the thin film transistor to be formed thereafter. The above described materials of the undercoat layers are mere examples. The undercoat layer 14a is omissible when the first substrate 10 is made of glass.

A semiconductor layer 16 is formed on the undercoat layer 14c. A gate insulating film 22 is formed covering the semiconductor layer 16. A gate electrode 24 is formed on the gate insulating film 22. Interlayer insulating films 26a, 26b are formed covering the gate electrode 24. The interlayer insulating film 26a is formed using a silicon nitride film, for example, and the interlayer insulating film 26b is formed using a silicon oxide film, for example.

A source electrode 18 and a drain electrode 20 are electrically connected to the semiconductor layer 16 through a contact hole penetrating the gate insulating film 22 and the interlayer insulating films 26a, 26b. The semiconductor layer 16, the source electrode 18, the drain electrode 20, and the gate electrode 24 together constitute a thin film transistor. A planarization layer 32 is formed on the thin film transistor. The planarization layer 32 has a flat surface where at least a pixel electrode 34 is formed. For the planarization layer 32, organic material such as photosensitive acrylic resin, or the like, is often used. A plurality of pixel electrodes 34 (for example, a positive electrode) are formed on the planarization layer 32, each corresponding to each of the plurality of unit pixels (sub-pixels). The pixel electrode 34 is electrically connected to one of the source electrode 18 and the drain electrode 20 on the semiconductor layer 16 through a contact hole 36 penetrating the planarization layer 32 and the passivation film 30. An insulating layer (bank) 38 is formed on the planarization layer 32 and the pixel electrode 34. The pixel electrode 34 is partially exposed in an opening formed in the bank 38.

A light emitting layer 40 is formed on the pixel electrode 34. The light emitting layer 40 is formed separately for every pixel electrode 34, and lies on the insulation layer 38 as well. The light emitting layer 40 emits light from a partial area thereof that is in contact with the pixel electrode 34. The partial area of the light emitting layer 40 that emits light will be hereinafter referred to as a light emitting area L.

The light emitting layer 40 emits light in blue, red, or green, depending on the pixels, though the color corresponding to each pixel is not limited to the above-mentioned colors, and yellow or white, for example, is applicable. The light emitting layer 40 is formed through deposition, for example. The light emitting layer 40 may be formed covering the entire display area M (see FIG. 1) across the plurality of pixels. That is, the light emitting layer 40 may be formed continuous on the insulation layer 38. The light emitting layer 40 may be formed through coating through solvent dispersion. In the case of a light emitting layer 40 formed across the plurality of pixels, the light emitting layer 40 may emit light in white for all sub-pixels, and a part of a wavelength for a desired color may be extracted through a color filter (not shown).

On the light emitting layer 40, a counter electrode 42 (a common electrode or a negative electrode) is formed. The counter electrode 42 lies on the insulation layer 38 that constitutes a bank. The light emitting layer 40, the pixel electrode 34, and the counter electrode 42 together constitute a light emitting element 44, in which the light emitting layer 40 is held between the pixel electrode 34 and the counter electrode 42. Each of the plurality of pixels includes the light emitting element 44. The light emitting layer 40 between the pixel electrode 34 and the counter electrode 42 emits light with brightness controlled by a current flowing across the pixel electrode 34 and the counter electrode 42. At least one of a hole transport layer and a hole injection layer (both not shown) may be formed between the light emitting layer 40 and the pixel electrode 34. At least one of an electron transport layer and an electron injection layer (both not shown) may be formed between the light emitting layer 40 and the counter electrode 42.

The light emitting element 44 is covered, and thereby sealed, by a sealing film 46 formed on the counter electrode 42, thereby being shut off from water. The sealing film 46 includes at least one inorganic insulating layer including silicon nitride (SiN), for example, and may have a laminated structure including a plurality of insulating layers. As illustrated in FIG. 5, in the first embodiment, the sealing film 46 has a laminated structure including an organic insulating layer 52 made of resin, for example, and a pair of inorganic insulating layers 48, 50 holding the organic insulating layer 52 in-between. The sealing film 46 covers the display area M.

The display device 100 includes a pressure sensor S on the inorganic insulating layer 50 (the sealing film 46). The pressure sensor S includes a first electrode 56, a second electrode 58, a third electrode 66, a dielectric layer 68, and an elastic layer 67. Although the elastic layer 67 illustrated has a round cross section, this is not intended to be exclusive, and the elastic layer 67 may have a cross section in any other shape.

The first electrodes 56 are disposed discretely on the sealing film 46 above at least the display area M (see FIGS. 3 to 5). A plurality of dielectric layers 68 are formed discretely on each first electrode 56 (see FIGS. 4 and 5), and the second electrode 58 is formed on each dielectric layer 68. That is, a plurality of second electrodes 58 are formed each on each dielectric layer 68. The plurality of elastic layers 67 are formed on each first electrode in an area not overlapping the dielectric layer 68 and the second electrode 58 (see FIGS. 4 and 5). The third electrode 66 is formed continuously in an area over the plurality of first electrodes 56, the plurality of dielectric layers 68, the plurality of second electrodes 58, and the plurality of elastic layers 67 (see FIG. 5).

The dielectric layer 68 and the second electrode 58 are formed in an area outside the light emitting area L in a plan view so as not to shield the light emitted.

Details of the pressure sensor S according to the first embodiment will be described with reference to FIG. 6 and FIG. 7. FIG. 6 explains touch detection by a pressure sensor according to the first embodiment. FIG. 7 schematically illustrates a pressure sensor that constitutes a capacitor.

The pressure sensor S is used to detect presence of a touch on the display area M (a display screen) of the display device 100 with a finger, a touch pen, or the like. That is, the pressure sensor S can be rephrased as a sensor that detects a pressure applied by a finger or the like pressing the display area M. In the first embodiment, an electrostatic capacitance method is employed as a sensing method. In the pressure sensor S, the first electrode 56, the second electrode 58, the third electrode 66, and the dielectric layer 68 together constitute a capacitor. A plurality of capacitors constituting the pressure sensor S are connected in parallel.

Figure 6A:
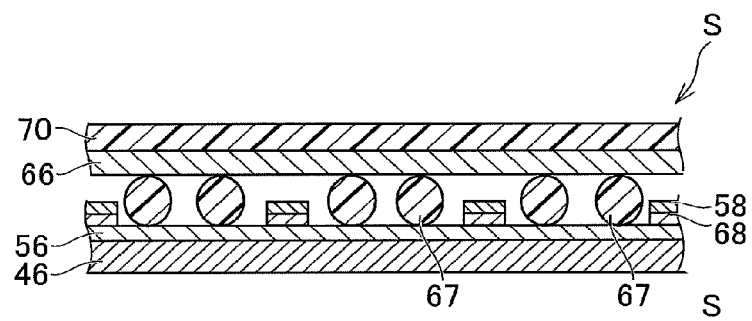
Figure 7A:
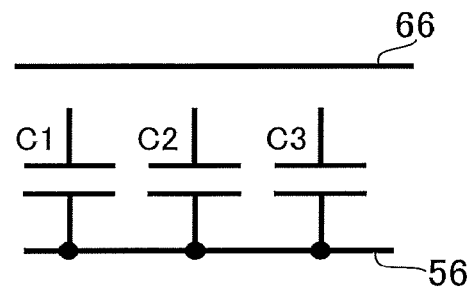
FIG. 7A is a conceptual diagram illustrating a capacitor in the condition illustrated in FIG. 6A.

FIG. 6A is a cross sectional view of the pressure sensor with the display area M not pressed with a finger or the like. That is, FIG. 6A illustrates the pressure sensor with no load applied to the display area M. FIG. 7A is a conceptual diagram illustrating a capacitor in the condition illustrated in FIG. 6A. In this condition, the third electrode 66 remains spaced apart from the second electrode 58. When the display area M in this condition illustrated in FIG. 6A is pressed with a finger or the like with a force weaker than a force F1 to be described later, the counter substrate 70 and the third electrode 66 sag at a position pressed with the finger (at the center of the pressed area) so as to get closer to the second electrode 58. That is, the distance between the third electrode 66 and the second electrode 58 becomes shorter.

Figure 6B:
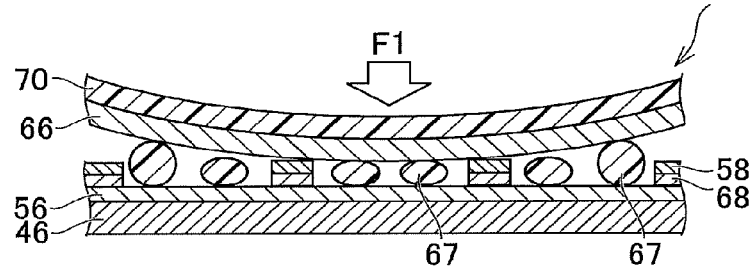
Figure 7B:
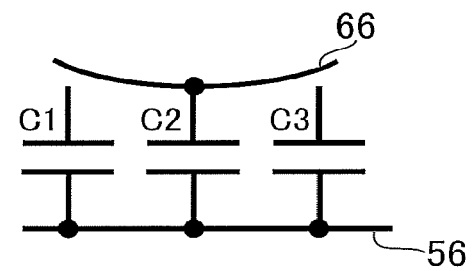
FIG. 7B is a conceptual diagram illustrating the capacitor under the condition illustrated in FIG. 6B.

FIG. 6B illustrates the pressure sensor with the display area M pressed with a finger or the like. The counter substrate 70 and the third electrode 66 pressed by a finger sag at a position pressed by the finger (at the center of the pressed area). With the third electrode 66 sagging, the elastic layer 67 is pressed by the third electrode 66 sagging and thereby compressed. As illustrated in FIG. 6B, when the display area M is pressed with a predetermined force F1, the third electrode 66 touches the second electrode 58. FIG. 7B is a conceptual diagram illustrating the capacitor under the condition illustrated in FIG. 6B. A synthetic electrostatic capacitance under this condition is defined as C2.

Figure 6C:
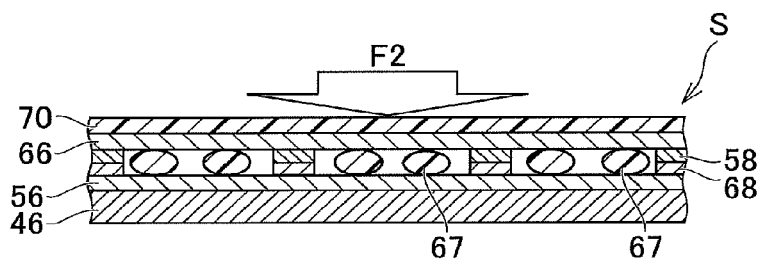
FIG. 6C illustrates a pressure sensor with the display area pressed with a force F2 stronger than the force F1.
Figure 7C:
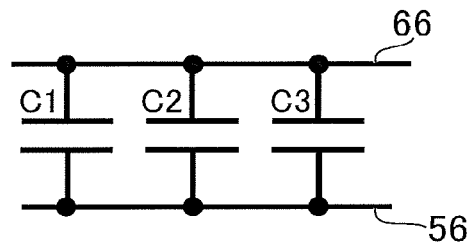
FIG. 7C is a conceptual diagram illustrating the capacitor in the condition illustrated in FIG. 6C.

FIG. 6C illustrates a pressure sensor with the display area M pressed with a force F2 stronger than the force F1. In this case, the third electrode 66 touches the second electrode 58 at a larger number of points than those when the display area M is pressed with the force F1. FIG. 7C is a conceptual diagram illustrating the capacitor in the condition illustrated in FIG. 6C. The synthetic electrostatic capacitance under this condition is defined as C1+C2+C3. That is, the stronger the force with which the display area M is pressed is, the larger the synthetic electrostatic capacitance of the capacitor constituting the pressure sensor S becomes. Although the third electrode 66 is touching all second electrodes 58 in FIG. 6C, the third electrode 66 does not sag and thus does not touch the second electrode 58 in an area remote from the point pressed with a finger or the like (at the center of the pressed area).

The amount of change in distance between the third electrode 66 and the second electrode 58 simply formed as parallel panels, the change being caused upon pressing, that is, the amount of change in mutual electrostatic capacitance, is too small to be detected and referred to for recognition based thereon of the strength of a force pressing. In the structure in the first embodiment, on the other hand, the electrostatic capacitance will linearly change in conformity with the number of points where the third electrode 66 touches the second electrode 58, and the amount of change in electrostatic capacitance is large enough to be referred to for recognition based thereon of the strength of a force pressing. That is, in the first embodiment, presence of a touch is detected based on the number of capacitors connected in parallel. Employment of this structure enables more accurate detection of change in electrostatic capacitance, and thus more accurate detection of the presence of a touch.

Figure 8:
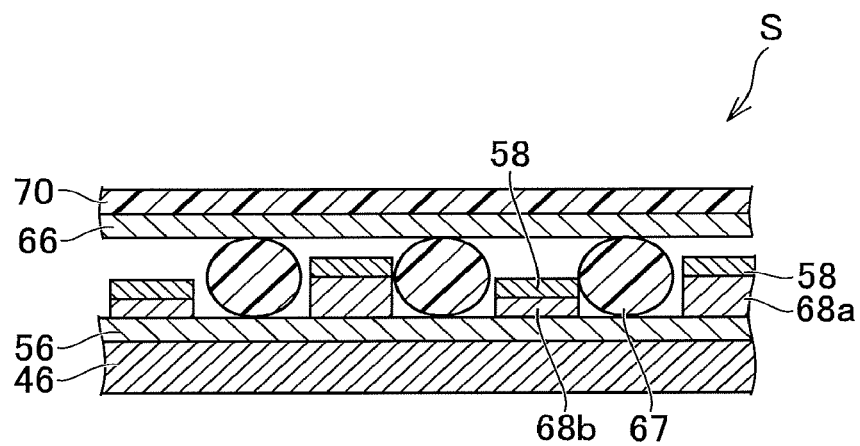
FIG. 8 is a cross sectional view of a pressure sensor according to a first modified example of the first embodiment.

FIG. 8 is a cross sectional view of a pressure sensor according to a first modified example of the first embodiment. While the pressure sensor S in FIG. 6 includes a plurality of dielectric layers 68 having substantially same film thicknesses, the pressure sensor S in FIG. 8 includes dielectric layers having different film thicknesses. Structures other than the dielectric layers having different film thicknesses are similar to those described with reference to FIGS. 1 to 7, and thus given the same reference numerals and not described again.

The pressure sensor S in the first modified example includes a dielectric layer 68a and a dielectric layer 68b having a thinner film thickness than that of the dielectric layer 68a. On the respective dielectric layers 68a, 68b, second electrodes 58 having substantially the same film thicknesses are formed. In this structure, the distance between the third electrode 66 and the second electrode 58 on the dielectric layer 68a is shorter than that between the third electrode 66 and the second electrode 58 on the dielectric layer 68b.

When the display area M is pressed with a finger or the like, the third electrode 66 sags and the elastic layer 67 is compressed. Then, when the third electrode 66 touches the second electrode 58 on the dielectric layer 68a, a capacitor is formed, and the electrostatic capacitance largely changes. When the display area M is pressed with a stronger force, the elastic layer 67 is further compressed. Then, when the third electrode 66 touches the second electrode 58 on the dielectric layer 68b, a capacitor is formed, and the electrostatic capacitance largely changes. Provision of areas where the respective distances between the second electrode 58 and the third electrode 66, as described above, are different enables distinct discrimination of steps at which the electrostatic capacitance largely changes in accordance with the strength of a force with which the display area M is pressed. This enables more accurate detection of the presence of a touch.

The dielectric layer 68a and the dielectric layer 68b are alternately arranged in FIG. 8, which, however, is not intended to be exclusive. For example, two adjacent dielectric layers 68a may be arranged adjacent to two adjacent dielectric layers 68b.

Figure 9:
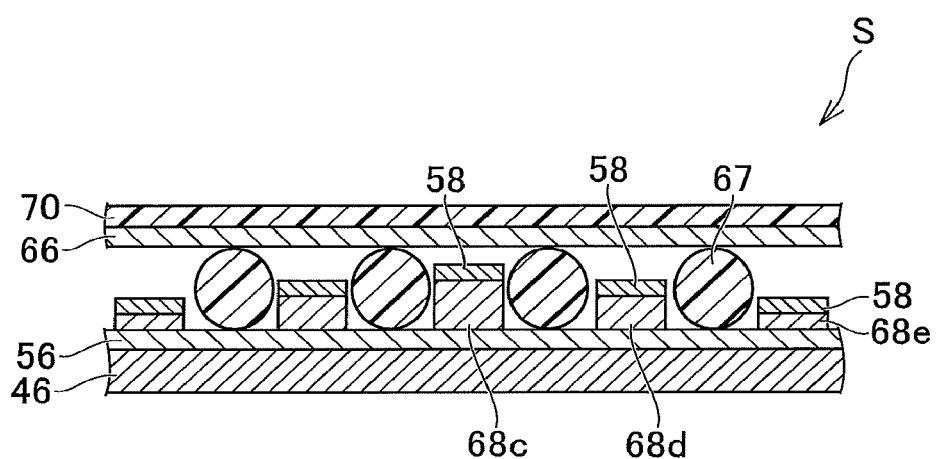
FIG. 9 is a cross sectional view of a pressure sensor according to a second modified example of the first embodiment.

FIG. 9 is a cross sectional view of a pressure sensor in a second modified example of the first embodiment. In the second modified example of the first embodiment, which employs a structure including dielectric layers having different film thicknesses, similar to the first modified example, the number of the dielectric layers having different film thicknesses and the arrangement thereof are different from those in the first modified example.

In the second modified example, a structure including three kinds of dielectric layers 68c, 68d, 68e having mutually different film thicknesses is employed. Similar to the first modified example, the film thicknesses of the second electrodes 58 formed on the respective dielectric layers 68c, 68d, 68e are substantially the same.

In the second modified example as well, when the display area M is pressed with a finger or the like, the third electrode 66 sags, and the elastic layer 67 is compressed. Then, when the third electrode 66 touches the second electrode 58 on the dielectric layer 68c, a capacitor is formed, and the electrostatic capacitance thus large changes. When the display area M is pressed with a stronger force, the elastic layer 67 is compressed. Then, when the third electrode 66 touches the second electrode 58 on the dielectric layer 68d, a capacitor is formed, and the electrostatic capacitance largely changes. When the display area M is pressed with a further stronger force, the elastic layer 67 is further compressed. Then, when the third electrode 66 touches the second electrode 58 on the dielectric layer 68e, a capacitor is formed, and the electrostatic capacitance largely changes. Provision of areas with different distances between the second electrode 58 and the third electrode 66, as described above, enables distinct discrimination of steps at which the electrostatic capacitance changes largely in accordance with the strength of a force with which the display area M is pressed. This enables more accurate detection of the presence of a touch. The array of the dielectric layer 68c, the dielectric layer 68d, and the dielectric layer 68e may be different from that in FIG. 9.

Figure 10:
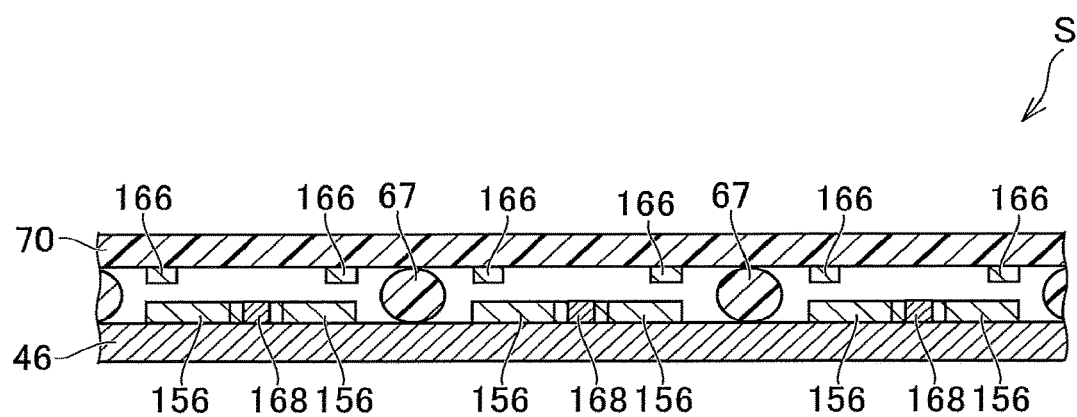
FIG. 10 is a cross sectional view of a pressure sensor according to a second embodiment.
Figure 11:
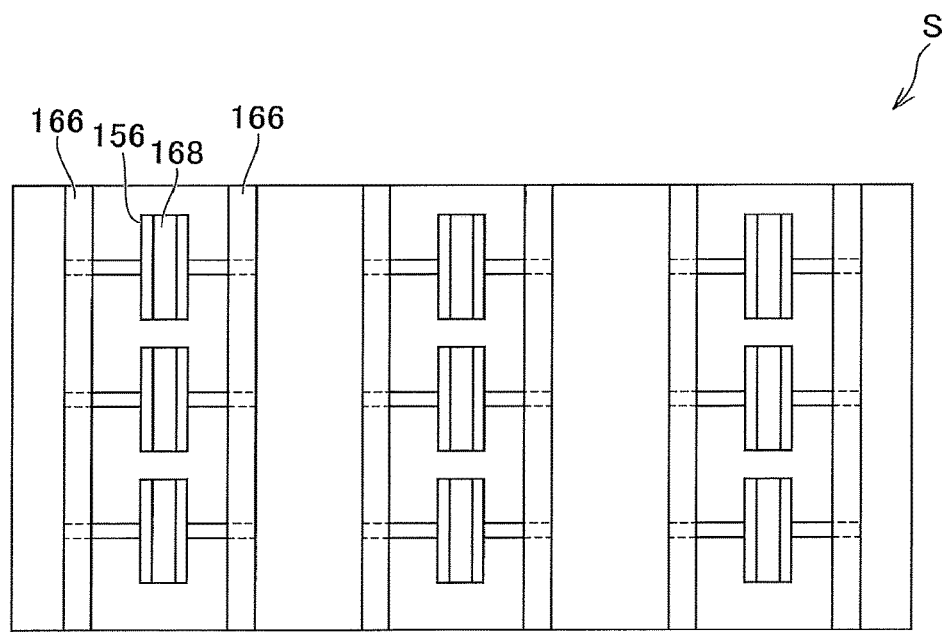
FIG. 11 is a plan view of a pressure sensor according to the second embodiment.

The below describes a second embodiment of the present invention, with reference to FIGS. 10 and 11. FIG. 10 is a cross sectional view of a pressure sensor according to the second embodiment. FIG. 11 is a plan view of a pressure sensor according to the second embodiment.

The pressure sensor S according to the second embodiment includes a first electrode 156, a dielectric layer 168, a second electrode 166, and the elastic layer 67. The first electrode 156 is formed on the sealing film 46. The dielectric layer 168 is formed in the same layer as that of the first electrode 156 and between the first electrodes 156. The second electrode 166 is formed on the lower surface of the counter substrate 70 above, and spaced apart from, the first electrode 156. The elastic layer 67 is formed contacting the counter substrate 70 and the sealing film 46.

When the display area M is pressed with a finger or the like, the counter substrate 70 sags, and the elastic layer 67 is compressed. Then, when the second electrode 166 touches the first electrode 156, the first electrode 156, the second electrode 166, and the dielectric layer 168 together constitute a capacitor, and the electrostatic capacitance largely changes. Employment of this structure enables accurate detection of the presence of a touch, similar to the first embodiment. Formation of the dielectric layer 168 in the same layer as that of the first electrode 156 enables a thinner pressure sensor S, as compared with that in the first embodiment.

Figure 12:
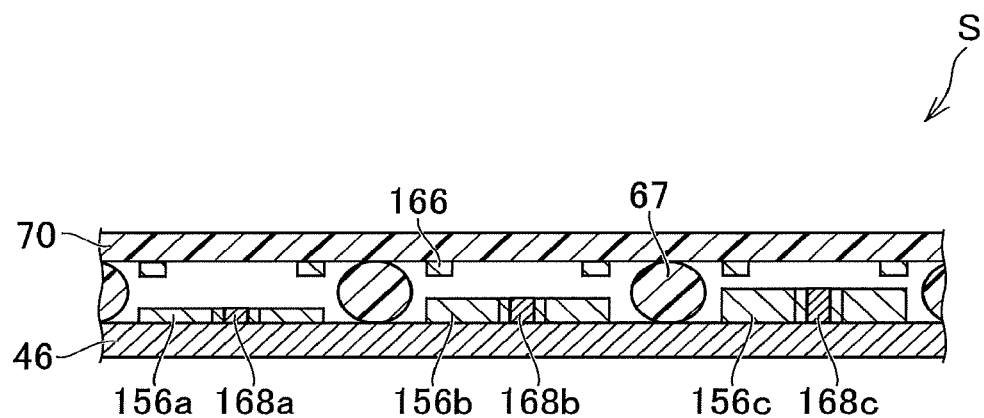
FIG. 12 is a cross sectional view of a pressure sensor according to a modified example of the second embodiment.

FIG. 12 is a cross sectional view of a pressure sensor according to a modified example of the second embodiment. The structure in the modified example of the second embodiment differs from the structure illustrated in FIG. 10 in that the former includes dielectric layers and first electrodes having different film thicknesses. Other structures are the same as those in FIG. 10, and thus given the same reference numerals and not described again.

As illustrated in FIG. 12, the pressure sensor S in the modified example of the second embodiment includes a first electrode 156a and a dielectric layer 168a both formed in the same layer and having the substantially same film thicknesses. The pressure sensor S further includes a first electrode 156b and a dielectric layer 168b both formed in the same layer and having the substantially same film thicknesses, and a first electrode 156c and a dielectric layer 168c both formed in the same layer and having the substantially same film thicknesses.

When the display area M is pressed with a finger or the like, the counter substrate 70 sags, and the elastic layer 67 is thus compressed. Then, when the second electrode 166 touches the first electrode 156c, a capacitor is formed, and the electrostatic capacitance largely changes. When the display area M is pressed with a stronger force, the elastic layer 67 is compressed. Then, when the second electrode 166 touches the first electrode 156b, a capacitor is formed, and the electrostatic capacitance largely changes. When the display area M is pressed with a further stronger force, the elastic layer 67 is further compressed. Then, when the second electrode 166 touches the first electrode 156a, a capacitor is formed, and the electrostatic capacitance largely changes. Provision of areas with different distances between the first electrode and the second electrode, as described above, enables distinct discrimination of steps at which the electrostatic capacitance largely changes in accordance with the strength of a force with which the display area M is pressed. This enables more accurate detection of the presence of a touch.

Although FIG. 12 illustrates a structure having three kinds of first electrodes and dielectric layers having different film thicknesses, this structure is not intended to be exclusive. For example, the structure may include two kinds of first electrodes and dielectric layers having different film thicknesses. The array of the first electrodes and dielectric layers is not limited to that illustrated in FIG. 12.

In the above described embodiments, a touch panel that can detect a position touched may be additionally formed on the pressure sensor S, which is not described, though.

The display device is not limited to an organic electroluminescence display device, and may be a display device having a light emitting element, such as a quantum-dot light emitting diode (QLED), in each pixel, or a liquid crystal display device.

The present invention is not limited to the above described embodiments, and various modifications are possible. For example, a structure described in the embodiments can be replaced by a substantially equivalent structure or a structure producing the same effect or achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device having a pressure sensor, comprising:
    a display area where a plurality of pixels are arranged in a matrix;
    a sealing film formed covering the display area; and
    a pressure sensor mounted on the sealing film,
    wherein
    the pressure sensor comprises
        a plurality of first electrodes formed discretely on the sealing layer at positions above the display area,
        a plurality of dielectric layers formed discretely on each of the plurality of first electrodes,
        a plurality of second electrodes formed on the plurality of dielectric layers,
        an elastic layer formed on each of the plurality of first electrodes in an area not overlapping the plurality of dielectric layers and the plurality of second electrodes, and
        a third electrode formed continuously in an area over the plurality of first electrodes, the plurality of dielectric layers, the plurality of second electrodes, and the plurality of elastic layers,
    the third electrode is spaced apart from the second electrode, and
    the elastic layer is in contact with the first electrode and the third electrode.

2. The display device according to claim 1, wherein
    each of the plurality of pixels includes a light emitting area, and
    the plurality of dielectric layers and the plurality of second electrodes are formed in an area not overlapping the light emitting area in a plan view.

3. The display device according to claim 1, wherein the plurality of dielectric layers include dielectric layers having mutually different film thicknesses.

4. The display device according to claim 3, wherein the dielectric layers having mutually different film thicknesses are formed on a same first electrode of the plurality of first electrodes.

5. The display device according to claim 1, wherein
    a distance between one of the plurality of first electrodes and one of the plurality of second electrodes formed on the one of the plurality of first electrodes differs from a distance between another one of the plurality of first electrodes and another one of the plurality of second electrodes formed on the other one of the plurality of first electrodes.

6. A display device having a pressure sensor, comprising:
    a display area where a plurality of pixels are arranged in a matrix;
    a sealing film formed covering the display area;
    a pressure sensor mounted on the sealing film; and
    a counter substrate disposed on the pressure sensor so as to face the display area,
    wherein
    the pressure sensor comprises
        a plurality of first electrodes formed discretely on the sealing layer at positions above the display area,
        a plurality of dielectric layers formed on the sealing film and between the plurality of first electrodes,
        an elastic layer formed on the sealing film in an area not overlapping the plurality of first electrodes and the plurality of dielectric layers, and
        a second electrode formed above the respective first electrodes that sandwich the dielectric layer, and
    the second electrode is spaced apart from the first electrode, and
    the elastic layer is in contact with the sealing film and the counter substrate.

7. The display device according to claim 6, wherein
    each of the plurality of pixels includes a light emitting area, and
    the plurality of dielectric layers and the plurality of second electrodes are formed in an area not overlapping the light emitting area in a plan view.

8. The display device according to claim 6, wherein the plurality of dielectric layers include dielectric layers having mutually different film thicknesses.

9. The display device according to claim 8, wherein the dielectric layers having mutually different film thicknesses are formed on a same first electrode of the plurality of first electrodes.

10. The display device according to claim 6, wherein a distance between one of the plurality of first electrodes and one of the plurality of second electrodes formed on the one of the plurality of first electrodes differs from a distance between another one of the plurality of first electrodes and another one of the plurality of second electrodes formed on the other one of the plurality of first electrodes.

* * * * *